(12) United States Patent
Murduck et al.

(10) Patent No.: US 11,024,791 B1
(45) Date of Patent: Jun. 1, 2021

(54) MAGNETICALLY STABILIZED MAGNETIC JOSEPHSON JUNCTION MEMORY CELL

(71) Applicants: James Matthew Murduck, Ellicott City, MD (US); Melissa G. Loving, College Park, MD (US); Thomas F. Ambrose, Crownsville, MD (US)

(72) Inventors: James Matthew Murduck, Ellicott City, MD (US); Melissa G. Loving, College Park, MD (US); Thomas F. Ambrose, Crownsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/773,325

(22) Filed: Jan. 27, 2020

(51) Int. Cl.
| | | |
|---|---|---|
| *H01L 39/22* | (2006.01) | |
| *H01L 43/02* | (2006.01) | |
| *H01L 43/12* | (2006.01) | |
| *H01L 39/02* | (2006.01) | |
| *H01L 39/24* | (2006.01) | |
| *H01L 27/22* | (2006.01) | |
| *H01L 27/18* | (2006.01) | |

(52) U.S. Cl.
CPC .......... *H01L 39/223* (2013.01); *H01L 39/025* (2013.01); *H01L 39/2493* (2013.01); *H01L 43/02* (2013.01); *H01L 43/12* (2013.01); *H01L 27/18* (2013.01); *H01L 27/222* (2013.01)

(58) Field of Classification Search
CPC ..... H01L 39/223; H01L 43/12; H01L 39/025; H01L 39/2493; H01L 43/02; H01L 27/18; H01L 27/222
See application file for complete search history.

(56) References Cited

U.S. PATENT DOCUMENTS

| 3,613,699 A | 10/1971 | Holm |
| 4,151,605 A | 4/1979 | Faris |
| | (Continued) | |

FOREIGN PATENT DOCUMENTS

| EP | 3266024 A1 | 1/2018 |
| EP | 3350808 A2 | 7/2018 |
| | (Continued) | |

OTHER PUBLICATIONS

Maffitt et al/ Design considerations for MRAM IBM Journal of Research and Development vol. 50 issue 1 https://ieeexplore.ieee.org/document/5388777. (Year: 2006).*

(Continued)

*Primary Examiner* — Matthew L Reames
(74) *Attorney, Agent, or Firm* — Tarolli, Sundheim, Covell & Tummino LLP

(57) ABSTRACT

A memory cell is provided that comprises a first superconductor electrode, a second superconductor electrode, and a magnetic Josephson junction (MJJ) stack disposed between the first superconductor electrode and the second superconductor electrode. The MJJ stack includes a magnetic reference layer and a magnetic storage layer. The memory cell further comprises a magnetically stabilizing structure disposed between the MJJ stack and the second superconductor electrode, wherein the magnetic stabilizing structure magnetically couples with the magnetic reference layer to strengthen the fixed state of the magnetic reference layer.

20 Claims, 5 Drawing Sheets

(56) References Cited

U.S. PATENT DOCUMENTS

| | | | |
|---|---|---|---|
| 4,360,898 | A | 11/1982 | Faris |
| 4,601,015 | A | 7/1986 | Ishida |
| 4,916,335 | A | 4/1990 | Goto et al. |
| 5,114,912 | A | 5/1992 | Benz |
| 5,229,962 | A | 7/1993 | Yuh et al. |
| 5,260,264 | A | 11/1993 | Kurosawa et al. |
| 5,276,639 | A | 1/1994 | Inoue |
| 5,309,038 | A | 5/1994 | Harada et al. |
| 5,323,344 | A | 6/1994 | Katayama et al. |
| 5,365,476 | A | 11/1994 | Mukhanov |
| 5,398,030 | A | 3/1995 | Sandell |
| 5,793,697 | A | 8/1998 | Scheuerlein |
| 5,872,731 | A | 2/1999 | Chan et al. |
| 5,942,765 | A | 8/1999 | Miyahara et al. |
| 6,078,517 | A | 6/2000 | Herr |
| 6,242,939 | B1 | 6/2001 | Nagasawa et al. |
| 6,389,505 | B1 | 5/2002 | Emma et al. |
| 6,418,065 | B2 | 7/2002 | Sato et al. |
| 6,483,339 | B1 | 11/2002 | Durand et al. |
| 6,545,906 | B1 | 4/2003 | Savtchenko et al. |
| 6,680,868 | B2 | 1/2004 | Akamatsu |
| 6,710,986 | B1 | 3/2004 | Sato et al. |
| 6,836,141 | B2 | 12/2004 | Herr |
| 6,960,929 | B2 | 11/2005 | Bedard |
| 7,129,869 | B2 | 10/2006 | Furuta et al. |
| 7,252,852 | B1 | 8/2007 | Parkin |
| 7,365,663 | B2 | 4/2008 | Rylov et al. |
| 7,443,719 | B2 | 10/2008 | Kirichenko et al. |
| 7,505,310 | B2 | 3/2009 | Nagasawa et al. |
| 7,535,069 | B2 | 5/2009 | Abraham et al. |
| 7,786,748 | B1 | 8/2010 | Herr |
| 7,876,145 | B2 | 1/2011 | Koch |
| 7,977,964 | B2 | 7/2011 | Herr |
| 8,208,288 | B2 | 6/2012 | Bulzacchelli et al. |
| 8,270,209 | B2 | 9/2012 | Herr et al. |
| 8,547,732 | B2 | 10/2013 | Bulzacchelli et al. |
| 8,670,807 | B2 | 3/2014 | Rose et al. |
| 8,971,977 | B2 | 3/2015 | Mukhanov et al. |
| 9,013,916 | B2 | 4/2015 | Naaman et al. |
| 9,208,861 | B2 | 12/2015 | Herr et al. |
| 9,214,624 | B2 | 12/2015 | Lee et al. |
| 9,251,057 | B2 | 2/2016 | Higo et al. |
| 9,281,057 | B1 | 3/2016 | Herr et al. |
| 9,384,827 | B1 | 7/2016 | Reohr et al. |
| 9,443,576 | B1 | 9/2016 | Miller |
| 9,455,707 | B2 | 9/2016 | Herr et al. |
| 9,520,180 | B1 | 12/2016 | Mukhanov et al. |
| 9,520,181 | B1 | 12/2016 | Miller et al. |
| 9,646,682 | B1 | 5/2017 | Miller et al. |
| 9,653,153 | B2 | 5/2017 | Herr et al. |
| 9,656,682 | B2 | 5/2017 | Ahlemeier |
| 9,712,172 | B2 | 7/2017 | Shauck et al. |
| 9,761,305 | B2 | 9/2017 | Reohr et al. |
| 9,779,803 | B1 | 10/2017 | Konigsburg et al. |
| 9,812,192 | B1 | 11/2017 | Burnett et al. |
| 10,102,902 | B2 | 10/2018 | Burnett et al. |
| 10,417,136 | B2 | 9/2019 | Horner et al. |
| 10,447,278 | B1 | 10/2019 | Reohr et al. |
| 2002/0084453 | A1 | 7/2002 | Bozovic |
| 2005/0047245 | A1 | 3/2005 | Furuta et al. |
| 2006/0171190 | A1 | 8/2006 | Kawasumi |
| 2006/0203587 | A1 | 9/2006 | Li et al. |
| 2006/0255987 | A1 | 11/2006 | Nagasawa et al. |
| 2008/0048902 | A1 | 2/2008 | Rylov et al. |
| 2008/0175086 | A1 | 7/2008 | Luk et al. |
| 2009/0075825 | A1 | 3/2009 | Rose et al. |
| 2009/0244958 | A1 | 10/2009 | Bulzacchelli et al. |
| 2009/0303807 | A1 | 12/2009 | Lee et al. |
| 2010/0110803 | A1 | 5/2010 | Arai |
| 2011/0122675 | A1 | 5/2011 | Parkinson |
| 2011/0267878 | A1 | 11/2011 | Herr et al. |
| 2012/0108434 | A1 | 5/2012 | Bulzacchelli et al. |
| 2012/0120719 | A1 | 5/2012 | Worledge |
| 2012/0184445 | A1 | 7/2012 | Mukhanov et al. |
| 2013/0040818 | A1 | 2/2013 | Herr et al. |
| 2013/0258772 | A1 | 10/2013 | Lee et al. |
| 2015/0042373 | A1 | 2/2015 | Nakamura |
| 2015/0043273 | A1 | 2/2015 | Naaman et al. |
| 2015/0094207 | A1 | 4/2015 | Herr et al. |
| 2015/0188337 | A1 | 7/2015 | Dewa et al. |
| 2016/0013791 | A1 | 1/2016 | Herr et al. |
| 2017/0104491 | A1 | 4/2017 | Shauck et al. |
| 2018/0025775 | A1 | 1/2018 | Ambrose |
| 2020/0028512 | A1 | 1/2020 | Reohr et al. |
| 2020/0075093 | A1 | 3/2020 | Naaman |

FOREIGN PATENT DOCUMENTS

| | | |
|---|---|---|
| JP | H076329 A | 1/1995 |
| JP | H09128970 A | 5/1997 |
| JP | 2000090009 A | 3/2000 |
| JP | 2000091665 A | 3/2000 |
| JP | 2003318465 A | 11/2003 |
| JP | 2013529380 A | 7/2013 |
| JP | 2015525426 | 9/2015 |
| JP | 2016535383 A | 11/2016 |
| KR | 101801901 B1 | 11/2017 |
| WO | 2013180946 A1 | 12/2013 |
| WO | 2015050621 A1 | 4/2015 |
| WO | 2016007136 A1 | 1/2016 |
| WO | 2016140889 A1 | 9/2016 |
| WO | 2016183213 A1 | 11/2016 |
| WO | 2017091258 A2 | 6/2017 |
| WO | 2018044562 A2 | 3/2018 |
| WO | 2018185306 A1 | 10/2018 |
| WO | 2020205031 A2 | 10/2020 |

OTHER PUBLICATIONS

Canadian Office Action for Application No. 3053520 dated Oct. 14, 2020.

International Search Report for Application No. PCT/US2020/012570 dated Oct. 28, 2020.

Balaev D A et al., "Investigation of the Josephson coupling through a magentoactive barrier (ferrimagnet, paramagnet) in Y3/4Lu1/4Ba2Cu307+Y3(Al1−x Fe x )5012 composites", Physics of the Solid State, Nauka/Interperiodica, Mo, vol. 48, No. 11, Nov. 1, 2006, pp. 2046-2055, Xp019455820, ISSN: 1090-6460, DOI: 10.31134/S10637834061100023 p. 2046, right-hand column.

Popkov, et al, "Crossover from S—I—S to S—F—S junctions in composites Y"3"/"4Lu"1"/"4Ba"2Cu"30"7+Y"3 (Al"1"—"xFe"x)"50"1"2", Physica C, North-Holland Publishing, Amsterdam, NL, vol. 460-462, Aug. 28, 2007, pp. 1311-1312, XP022217696, ISSN: 0921-5434, DOI: 10.1016/J.PHYSC.2007.03348, p. 1311, left-hand column, line 14—p. 1312, right-hand column, line 2.

European Partial Search Report for Application No. 20188202.4-1206 dated Nov. 16, 2020.

Non Final Office Action for U.S. Appl. No. 16/256,547 dated Apr. 29, 2020.

Bell et al.: "Controllable Josephson Current Through a Pseudospin-Valve Structure"; Applied Physics Letters, vol. 84, No. 7, Feb. 16, 2004, Downloaded Dec. 11, 2008, 2004 American Institute of Physics, pp. 1153-1155.

Herr, et al.: "Towards a 16 Kilobit, Subnanosecond Josephson RAM"; Supercond. Sci. Techno. 12 (1999) 929-932, PII: S0953-2048(99)04840-X.

http://www.nitrd.gov/pubs/nsa/sta.pdf "Superconducting Technology Assessment", Aug. 2005.

Yoshikawa, et al.: "Characterization of 4 K CMOS Devices and Circuits for Hybrid Josephson-CMOS Systems"; IEEE Transactions on Applied Superconductivity, Vo. 15, No. 2, Jun. 2005, pp. 267-271.

Kirichenko, et al.: "Pipelined DC-Powered SFQ RAM"; IEEE Transactions on Applied Superconductivity, vol. 11, No. 1, Mar. 2001, pp. 537-540.

Weides, et al.: "Ferromagnetic 0-p Josephson Junctions"; arXiv:cond-mat/0701693v2 [cond-mat.supr-con] Apr. 27, 2007, pp. 1-6.

Bell, et al.: "Controllable Josephson Current Through a Pseudospin-Valve Structure"; Applied Physics Letters 84, 1153-1156, 2004.

(56) References Cited

OTHER PUBLICATIONS

Eschrig: "Spin-polarized Supercurrents for Spintronics"; Physics Today, Jan. 2011, 43-49.
Khaire, et al.: "Observation of Spin-Triplet Superconductivity in Co-Based Josephson Junctions"; Phys. Ref. Lett 104, 137002 (2010).
Robinson, et al.: "Controlled Injection of Spin-Triplet Supercurrents into a Strong Ferromagnet"; Science, 329, 59 (2010).
Slaughter: "Materials for Magnetoresistive Random Access Memory"; Annu. Rev. Mater. Res. 2009.39, 277 (2009).
Volkov, et al.: "Odd Spin-Triplet Superconductivity in a Multilayered Superconductor-Ferromagnet Josephson Junction"; Phys. Rev. B81, 144522 (2010).
Keizer, et al.: "A Spin Triplet Supercurrent Through the Half-Metallic Ferromagnet CrO2", Nature Publishing Group 2006, Retrieved from ProQuest: URL: http://search.proquest.com/docview/204549152/14092A830B16537D65/1?accountid=142944, pp. 825-827.
Beek, B. et al, Hybrid superconducting-magnetic memory device using competing order parameters, Nature Communications, vol. 5, May 2014.
Cini et al., "Magnetically induced pumping and memory storage in quantum rings", American Physical Society (APS), Physical Review B—Condensed Matter and Materials Physics, vol. 84, Issue 24, pp. 245201-1-245201-5, Dec. 8, 2011 (Dec. 8, 2011) [retrieved on Jun. 19, 2018 (Jun. 19, 2017) from: https://journals.aps.org/prb/Abstract/10.1103 PhysRevB.84.245201, also available at: https://arxiv.org/pdf/1112.0140.pdf ].
Vernik, et al.: "Magnetic Josephson Junctions with Superconducting Interlayer for Cryogenic Memory"; IEEE Transactions on Applied Superconductivity ( vol. 23, Issue: 3, Jun. 2013 ); found on the internet at: https://arxiv.org/ftp/arxiv/papers/1212/1212.0815.pdf; Jul. 11, 2018.
Ryazanov, et al.: "Magnetic Josephson Junction Technology for Digital and Memory Applications"; Physics Procedia, vol. 36, 2012, pp. 35-41; found on the Internet at: https://ac.els-cdn.com/S1875389212020639/1-s2.0-S1875389212020639-main.pdf?_tid=a1a93085-a2e8-40ff-a8fa-65b19483b626&acdnat=1531313726_d791c05385184f2df22a2ed34b3450f9 (Jul. 11, 2018).
Japanese Office Action for Patent Application No. 2019-544849 dated Jul. 10, 2020.
International Search Report for International Application No. PCT/US2020/017944 dated Jun. 29, 2020.
International Search Report for International Application No. PCT/US2019/046138 dated Jul. 21, 2020.
Tahara S et al: "Vortex Transitional Non-Destructive Read-Out Josephson Memory Cell",NEC Research and Development, Nippon Electric Ltd. Tokyo, JP'vol. 34, No. 4, Oct. 1, 1993 (Oct. 1, 1993), pp. 415-423, XP000424442, ISSN: 0547-051X A paragraph [0002]; figure 1.
Bell C et al: "Controllable Josephson current through a pseudospin-valve structure", Applied Physics Letters, vol. 84, No. 7, Feb. 16, 2004 (Feb. 16, 2004), pp. 1153-1155, XP012062116, ISSN:0003-6951, DOI:10.1063/1.1646217 page 1153.
Madden A et al: "Phase controllable Josephson junctions for cryogenic memory", Superconductor Science and Technology, vol. 32, No. 1, 015001, Nov. 16, 2018 (Nov. 16, 2018), XP020333147, ISSN: 0953-2048, DOI: 10.1088/1361-6668/AAE8CF section 2; figure 1.
Niedzielski B M et al: "Use of Pd-Fe and Ni-Fe-Nb as Soft Magnetic Layers in Ferromagnetic Josephson Junctions for Non-volatile Cryogenic Memory", IEEE Transactions on Applied Superconductivity, vol. 24, No. 4, 1800307, Aug. 2014 (Aug. 2014), XP011544947, ISSN: 1051-8223, DOI: 10.1109/TASC.2014.2311442 sections I I, I I I, V; figure 1.
International Search Report for ApplicatioN No. PCT/US2020/061835 dated Mar. 4, 2021.
Non Final Office Action for U.S. Appl. No. 17/021,675 dated Apr. 8, 2021.

* cited by examiner

MAGNETICALLY STABILIZED MAGNETIC JOSEPHSON JUNCTION MEMORY CELL

TECHNICAL FIELD

The present invention relates generally to superconductors, and more particularly to a magnetically stabilized magnetic Josephson junction memory cell.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. One hybrid memory solution has been proposed where the memory core implements CMOS technology and the bit-line detection is done with Josephson junction devices. However, such a configuration yields only nominally higher performance than standard CMOS and suffers from relatively high power dissipation for a cryogenic environment.

Superconducting electronics can be implemented to provide high-performance computing with low energy consumption. Superconducting Josephson junctions with magnetic barriers, also referred to as magnetic Josephson junctions (MJJs), can serve as the basis for Josephson magnetic random access memory (JMRAM), as disclosed in U.S. Pat. No. 8,270,209 B2, entitled "Josephson Magnetic Random Access Memory System and Method," which is herein incorporated by reference. JMRAM relies on the oscillation of the relative Cooper pair phase with magnetic layer thickness to produce junctions that exhibit a Josephson phase of either zero or $\pi$ radians, depending on the relative magnetic layer orientation. This binary phase switchability can be exploited to create superconducting memory elements capable of writing and reading a logical "0" or logical "1" state. Memory unit elements can be arranged in arrays of a memory system with read and write lines to create an addressable memory fabricated, for example, on an integrated circuit (IC) chip that can be cooled to superconducting temperatures (e.g., about four kelvins or less) in a cryogenic chamber. In certain circumstances, stray flux can create a false switching between logical states.

SUMMARY

In one example, a memory cell is provided that comprises a first superconductor electrode, a second superconductor electrode, and a magnetic Josephson junction (MJJ) stack disposed between the first superconductor electrode and the second superconductor electrode. The MJJ stack includes a magnetic reference layer and a magnetic storage layer. The memory cell further comprises a magnetically stabilizing structure disposed between the MJJ stack and the second superconductor electrode, wherein the magnetic stabilizing structure magnetically couples with the magnetic reference layer to strengthen the fixed state of the magnetic reference layer.

In another example, a memory cell is provided that comprises a first superconductor electrode, and a magnetic Josephson junction (MJJ) stack overlying the first superconductor electrode. The MJJ stack includes a magnetic reference layer and a magnetic storage layer, and a non-magnetic (NM) material layer that separates the magnetic reference layer from the magnetic storage layer. The memory cell further comprises a magnetically stabilizing structure overlying the MJJ stack. The magnetic stabilizing structure includes a via opening that extends from a first surface of the magnetically stabilizing structure to a first surface of the MJJ stack, wherein the magnetic stabilizing structure magnetically couples with the magnetic reference layer to strengthen the fixed state of the magnetic reference layer. The memory cell further comprises a second superconductor electrode overlying the magnetic stabilizing structure and having a cap portion and an extension plug, wherein the extension plug passes through the via opening and makes direct contact with the MJJ structure allowing for a current to pass through the memory cell without interference from the magnetically stabilizing structure.

In yet another example, a method of forming a memory cell is disclosed. The method comprises performing a series of deposition processes over a first superconductor electrode, the series of deposition processes comprising sequentially depositing material layers to form a magnetic Josephson junction (MJJ) stack overlying the first superconductor electrode, and a magnetically stabilizing structure overlying the MJJ stack. The method further comprises forming a mask over the magnetic stabilizing structure having a patterned opening, and performing an etch process to create a via opening that extends through the magnetic stabilizing structure from a first surface of the magnetically stabilizing structure to a first surface of the MJJ stack, wherein the magnetic stabilizing structure magnetically couples with the magnetic reference layer to strengthen the fixed state of the magnetic reference layer. The method also comprises performing a deposition process to form a second superconductor electrode overlying the magnetic stabilizing structure, the second superconductor electrode having a cap portion and an extension plug, such that the extension plug passes through the via opening and makes direct contact with the MJJ structure allowing for a current to pass through the memory cell without interference from the magnetically stabilizing structure.

DETAILED DESCRIPTION

Figure 2:
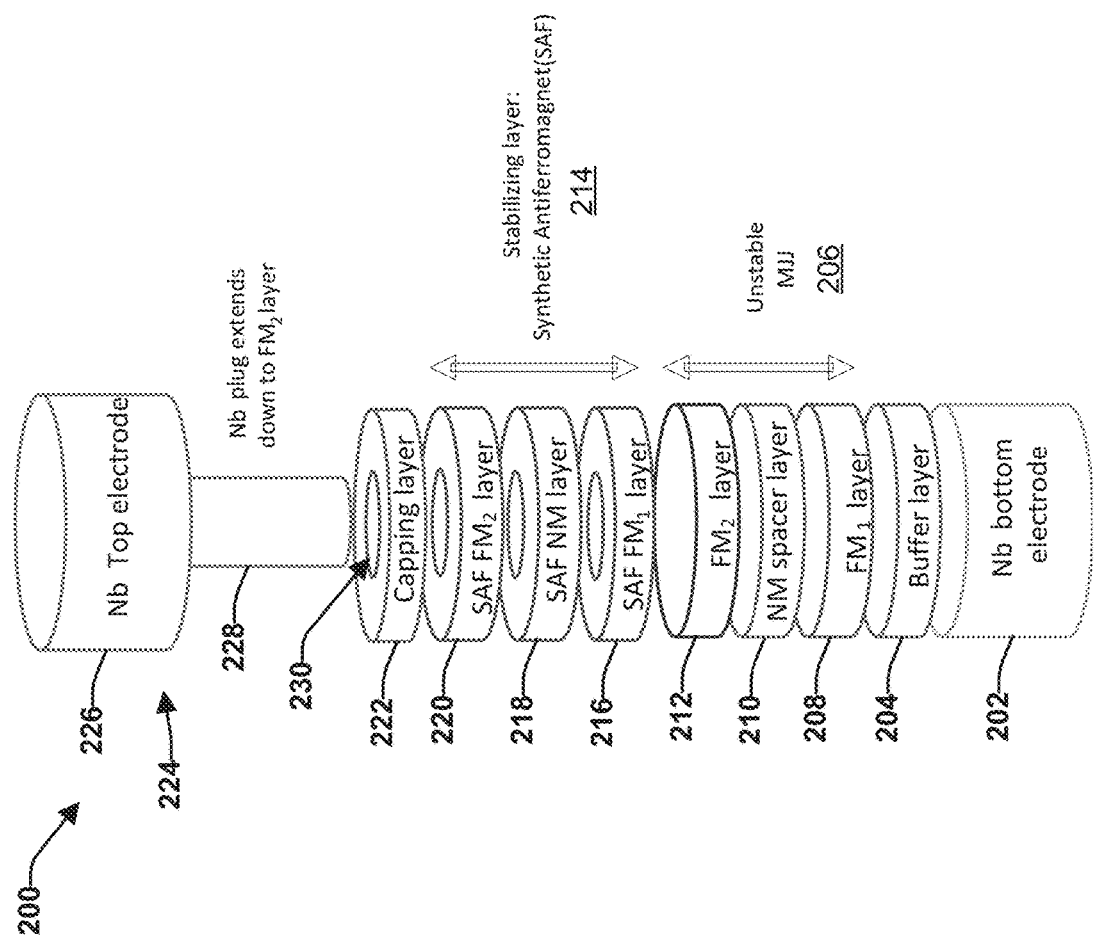
FIG. 2 illustrates an exploded view of another example of a MJJ memory cell.

The disclosure relates to a memory cell with a Magnetic Josephson junctions (MJJ) integrated with a magnetically stabilizing structure to stablize the magnetic reference layer within the MJJ. The MJJ includes a magnetic reference layer known as a fixed layer, and a magnetic storage layer known as a free layer seperated from one another by a nonmagnetic spacer layer. A MJJ employs a magnetic storage layer to hold the state of the memory cell, but also requires a fixed layer that provides the reference to compare to when reading the state of the memory cell. The magnetically stabilizing structure is magnetically coupled to the magnetic reference layer within the MJJ to hold or pin the magnetic reference layer in a fixed state, so that it will require a magnetic reversal field that is strong enough to overcome both the magnetic field of the magnetically stabilizing structure and the magnetic field of the magnetic reference layer combined. This assures that stray magnetic fields and fields applied to change the state of the magnetic storage layer will not change the magnetic state of the magnetic reference layer.

The MJJ can be used as the active element in a MJJ memory cell at cryogenic temperatures. The memory cell can be part of a memory array, while the memory array can reside in a memory system that includes the memory array and peripheral circuitry to read and write to the memory array. The employment of a magnetically stabilizing structure to pin the magnetic reference layer in the MJJ mitigates changes in state of the MJJ magnetic reference layer within the memory cell caused by stray flux, or reading or writing of the MJJ storage layer, while allowing large superconducting critical currents in the MJJ. The magnetically stabilizing structure can include ferromagnetic (FM), antiferromagnetic (AF), spacer layers of paramagnetic and diamagnetic material that stabilize the magnetic state of the MJJ without vastly diminishing the allowable critical current (Ic) through the MJJ. In one example, an antiferromagnetic layer is employed as the magnetically stabilizing structure, while in another example, a synthetic antiferromagnetic stack is employed as the magnetically stabilizing structure.

If the active FM storage "free" layer of a MJJ has a particular thickness (0-pi thickness), then an external magnetic field can drive it into a phase of 0 flux (0-phase) or ½ flux (pi-phase). This can then be used as a two-level memory element at cryogenic temperatures as is the basis of JMRAM. The present disclosure provides a magnetically stabilizing structure that decouples the barrier thickness of a MJJ with the necessary magnetically-stabilizing layers needed for a functional memory cell element. By making a via opening through the magnetically stabilizing structure in contact with the MJJ, and filling the via opening with a superconductor (e.g., niobium), the magnetically stabilizing structure will still be able to magnetically couple with the magnetic reference layer, but without exponentially decreasing the allowable MJJ supercurrent. In this way, a stable MJJ magnetic barrier can be optimized with respect to critical current density and allow targeting of the necessary 0-pi thickness needed for operation.

Figure 1:
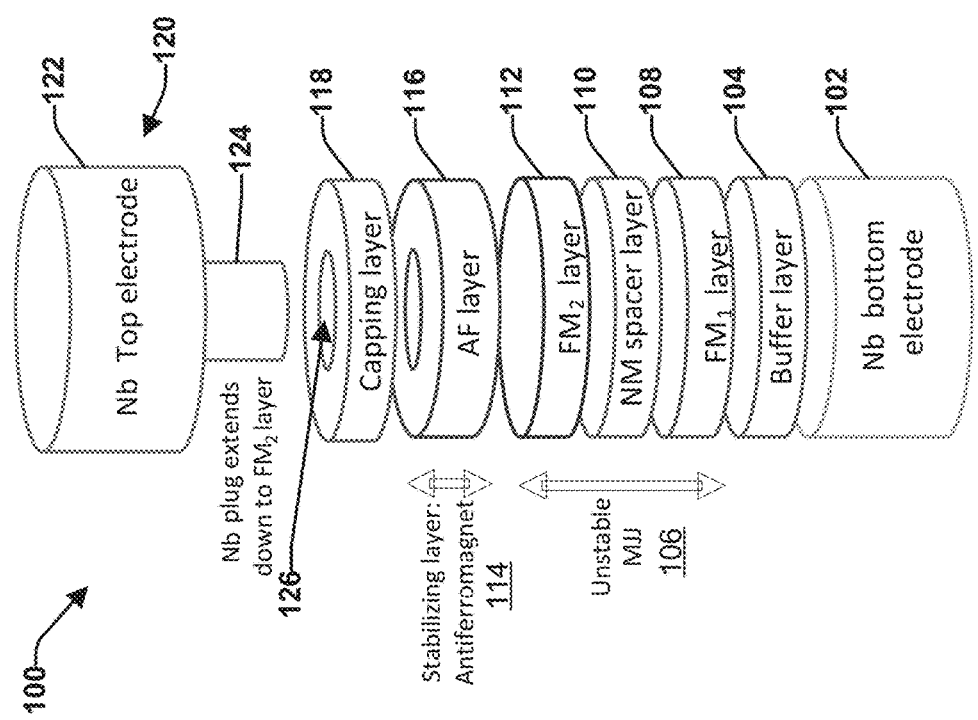
FIG. 1 illustrates an exploded view of an example of a MJJ memory cell.

FIG. 1 illustrates an exploded view of an example of a MJJ memory cell 100. The MJJ memory cell 100 employs an antiferromagnetic (AF) layer as a magnetically stabilizing structure to magnetically couple via exchange bias to a ferromagnetic layer that functions as a magnetic reference layer. The MJJ memory cell 100 includes a bottom superconductor electrode 102 (e.g., niobium) that forms a bottom superconductor electrode of the MJJ memory cell 100. A buffer layer 104 resides over the bottom superconductor electrode 102 to protect the bottom superconductor electrode 102 and a MJJ structure 106 from one another.

The MJJ structure 106 resides over the buffer layer 104. The MJJ structure 106 includes a first ferromagnetic ($FM_1$) layer 108 that resides over the buffer layer 104, a non-magnetic (NM) metal spacer layer 110 overlying the first ferromagnetic $FM_1$ layer 108, and a second ferromagnetic ($FM_2$) layer 112 overlying the non-magnetic (NM) spacer layer 110. The thickness range for both the first ferromagnetic $FM_1$ layer 108 and the second ferromagnetic $FM_2$ layer 112 are about 10 Å to about 35 Å, and can be formed of a NiFeX, $Ni_xFe_{1-x}$, $Ni_xCo_{1-x}$, or $Fe_xCo_{1-x}$ alloys or elemental Ni, Fe or Co. The non-magnetic (NM) metal spacer layer 110 can be any non-magnetic (NM) metal such as Cu, Ru Pd, Mo etc. with a thickness of about 25 Å to about 100 Å thick. A variety of other MJJ configurations could be employed in the memory cell 100 as long as they include a magnetic reference layer and a magnetic storage layer.

An antiferromagnetic (AF) layer 116 is disposed above the MJJ structure 106 and is magnetically coupled to the second ferromagnetic $FM_2$ layer 112 via exchange bias. Exchange bias is a magnetic phenomenon where a hysteresis loop, which relates the magnetic response of a material to an applied field, is shifted relative to the zero-field position. The antiferromagnetic (AF) layer 116 is a magnetic stabilizing structure and facilitates the stability and direction of the magnetic field in the second ferromagnetic $FM_2$ layer 112 pinning or holding the direction of the magnetic field fixed. The antiferromagnetic (AF) layer 116 can be formed of materials including FeMn, IrMn, PtMn, FeRh, NiO, CoO, Cr, CrPt etc. and have a thickness of about 25 Å to about 100 Å thick. A capping layer 118 is disposed over the antiferromagnetic (AF) layer 116 that separates a top superconductor electrode 120 from the antiferromagnetic (AF) layer 116. The capping layer 118 can be a non-magnetic (NM) metal layer, such as Cu or Ru with a thickness range of about 25 Å to about 50 Å thick.

The memory cell 100 incudes the necessary components for a memory device including a bottom, superconducting electrode (i.e. Nb) sandwiching a fixed $FM_2$ layer 112, with a high coercivity ($H_c$), and a free $FM_1$ layer 108, with a low $H_c$, separated by a normal non-magnetic (NM) metal layer 110. In an ideal system, the difference between $H_c$ of the fixed and free magnetic layers (i.e. $FM_1$ and $FM_2$) will create a distinct step in the magnetic hysteresis loop, which is necessary for the read/write mechanics of the memory system.

As illustrated in FIG. 1, the top superconductor electrode 120 includes a cap portion 122 for coupling to control circuitry, and an extension plug 124 configured to extend through a via opening 126 in the capping layer 118 and the antiferromagnetic (AF) layer 116, and make direct contact with the second ferromagnetic $FM_2$ layer 112 of the MJJ structure 106. Reduction of current that would otherwise occur due to the current path through the magnetic stabilizing structure is mitigated by having the extension plug pass through the magnetic stabilizing structure in direct contact with the MJJ structure 106 allowing for a high critical current to pass through the MJJ structure without losses cased by the magnetic stabilizing structure. The cap portion 122 and extension plug 124 can be, for example, the counter electrode or top electrode of the junction.

While not shown, in practice there would be a dielectric in between the cap/counter electrode and the outside and the top of the device. There would be a via opened in that dielectric that would allow the counter electrode to go into the via and contact the top of the barrier, completing the junction path. In one example, the width of that via can be 3 to 10× the depth. An alternate configuration of the device (FIG. 1) would be similar as above but would fill the via opening 126 with an additional ferromagnetic layer and then superconductor material (e.g., niobium). In this structural configuration, a synthetic antiferromagnet (SAF) would be formed that would be further stabilized by a surrounding wall of antiferromagnetic (AF) material.

FIG. 2 illustrates an exploded view of another example of a MJJ memory cell 200. The MJJ memory cell 200 employs a synthetic antiferromagnet (SAF) stack as a magnetically stabilizing structure to magnetically couple via direct exchange to a ferromagnetic layer that functions as a magnetic reference layer. The MJJ memory cell 200 includes a bottom superconductor electrode 202 (e.g., niobium) that forms a bottom superconductor electrode of the MJJ memory cell 200. A buffer layer 204 resides over the bottom superconductor electrode 202 to protect the bottom superconductor electrode 202 and a MJJ structure 206 from one another. The MJJ structure 106 resides over the buffer layer 204. The MJJ structure 206 includes a first ferromagnetic ($FM_1$) layer 208 that resides over the buffer layer 204, a non-magnetic (NM) metal spacer layer 210 overlying the first ferromagnetic $FM_1$ layer 208, and a second ferromagnetic $FM_2$ layer 212 overlying the non-magnetic (NM) spacer layer 210. The thickness ranges and material types for the MJJ structure 206 and the buffer layer 204 are similar to the thickness ranges and material types for the MJJ structure 106 and buffer layer 104 of FIG. 1.

A synthetic antiferromagnet (SAF) stack 214 is disposed above the MJJ structure 206 and is magnetically coupled to the second ferromagnetic $FM_2$ layer 212 via direct exchange. The synthetic antiferromagnet (SAF) stack 214 is a magnetic stabilizing structure and facilitates the stability and direction of the magnetic field in the second ferromagnetic $FM_2$ layer 212 pinning or holding the direction of the magnetic field fixed. The synthetic antiferromagnet (SAF) stack 214 can be formed of a first ferromagnet (SAF $FM_1$) layer 216 overlying the second ferromagnetic $FM_2$ layer 212, a non-magnetic (SAF NM) metal layer 218 overlying the first ferromagnet (SAF $FM_1$) layer 216, and a second ferromagnet (SAF $FM_2$) layer 229 overlying the non-magnetic (SAF NM) metal layer 218. The non-magnetic (SAF NM) metal layer 218 can be formed of a non-magnetic (NM) metal such as Ru, Cr, Cu with a thickness range of about 6 Å to about 20 Å. The first ferromagnet (SAF $FM_1$) layer 216 and the second ferromagnet (SAF $FM_2$) layer 220 can be formed of ferromagnetic materials, such as Fe, Co or Ni with a thickness range of about 10 Å to about 20 Å.

In a SAF structure, a thin NM layer separates two FM layers. These layers couple through the spacer in an antiparallel magnetization alignment. That is the two magnetic layers are magnetized in opposite direction similar to an antiferromagnet, and thus coupling the two magnetic layer together. The non-magnetic layer mediates the coupling strength. Coupling at the SAF/$FM_2$ interface pins the magnetization of $FM_2$. Coupling between the FM layers in the SAF structure forms a closed flux structure with zero net moment. Direct coupling between $FM_2$ and the SAF leads to a pinned magnetic reference layer.

A capping layer 222 is disposed over the synthetic antiferromagnet (SAF) stack 214 and separates a top superconductor electrode 224 from the synthetic antiferromagnet (SAF) stack 214. The capping layer 222 can be a non-magnetic (NM) metal layer such as Cu or Ru with a thickness range of about 25 Å to about 50 Å thick. The top superconductor electrode 224 includes a cap portion 226 for coupling to control circuitry, and an extension plug 228 configured to extend through a via opening 230 in the capping layer 222 and each layer of the synthetic antiferromagnet (SAF) stack 214, and make direct contact with the second ferromagnetic $FM_2$ layer 212. Reduction of current that would otherwise occur due to the current path through the magnetic stabilizing structure 214 is mitigated by having the extension plug 228 pass through the magnetic stabilizing structure 214 in direct contact with the MJJ structure 206 allowing for a high critical current to pass through the MJJ structure 206 without losses cased by the magnetic stabilizing structure 214.

Turning now to FIGS. 3-10, fabrication is discussed in connection with formation of the memory cell of FIG. 1. Although the present example is illustrated as a with respect to the example of FIG. 1, the fabrication process could be repeated with FIG. 2 with the only difference being that the deposition process include the replacement of the deposition of antiferromagnet (AF) material as shown in FIG. 1 with deposition of a synthetic antiferromagnet (SAF) stack as shown in FIG. 2.

Figure 3:
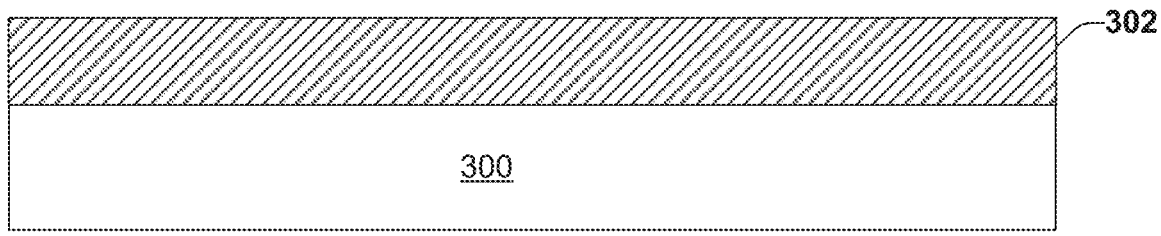
FIG. 3 illustrates a schematic cross-sectional view of a memory cell in its early stages of fabrication.
Figure 4:
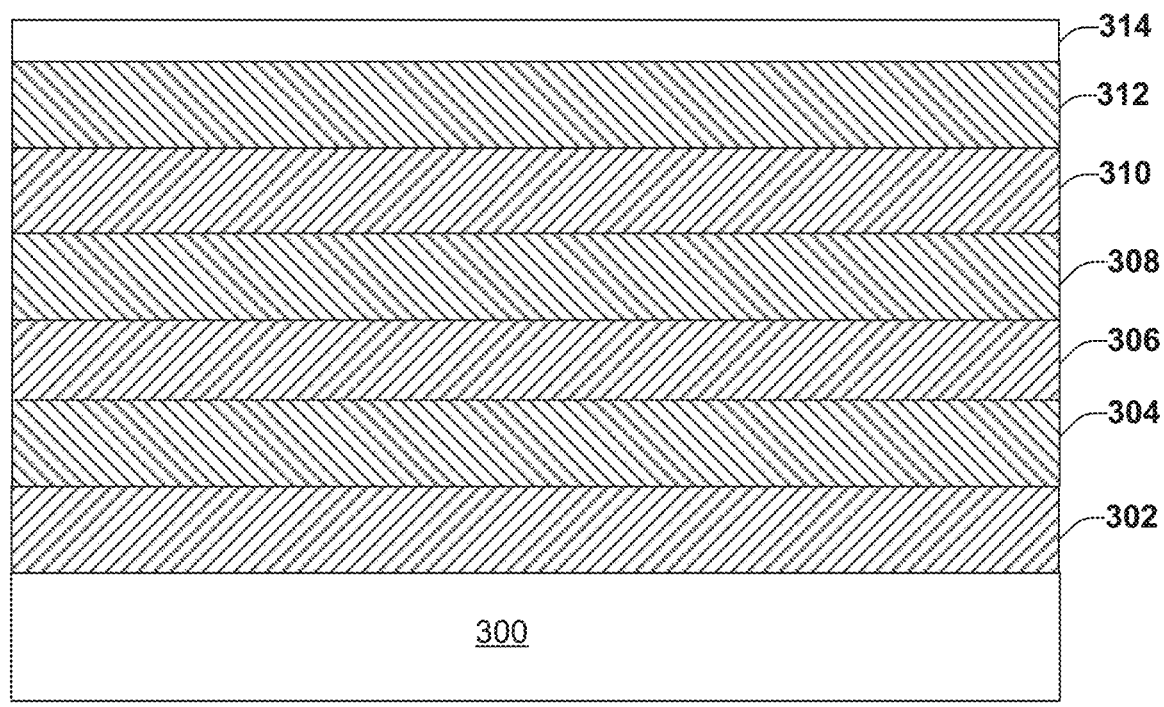
FIG. 4 illustrates a schematic cross-sectional view of the structure of FIG. 3 after undergoing a series of deposition processes over a first superconductor electrode.

FIG. 3 illustrates a cross-sectional view of a memory cell in its early stages of fabrication. A bottom superconductor electrode 302 (e.g., niobium) is formed overlying a substrate 300. The first substrate 300 can be a wafer formed of silicon, diamond or some other substrate material. Next, a series of deposition processes are performed to deposit a series of layers or films over the bottom superconductor electrode 302. The series of layers or films include a buffer layer 304 deposited over the superconductor electrode 302, a first ferromagnetic ($FM_1$) layer 306 deposited over the buffer layer 304, a non-magnetic (NM) metal spacer layer 308 deposited over the first ferromagnetic $FM_1$ layer 306, a second ferromagnetic ($FM_2$) layer 310 deposited over the non-magnetic (NM) spacer layer 308, an antiferromagnetic (AF) layer 312 deposited over the second ferromagnetic $FM_2$ layer 310 and a capping layer 314 deposited over the antiferromagnetic (AF) layer 312. The resultant structure is shown in FIG. 4.

Figure 5:
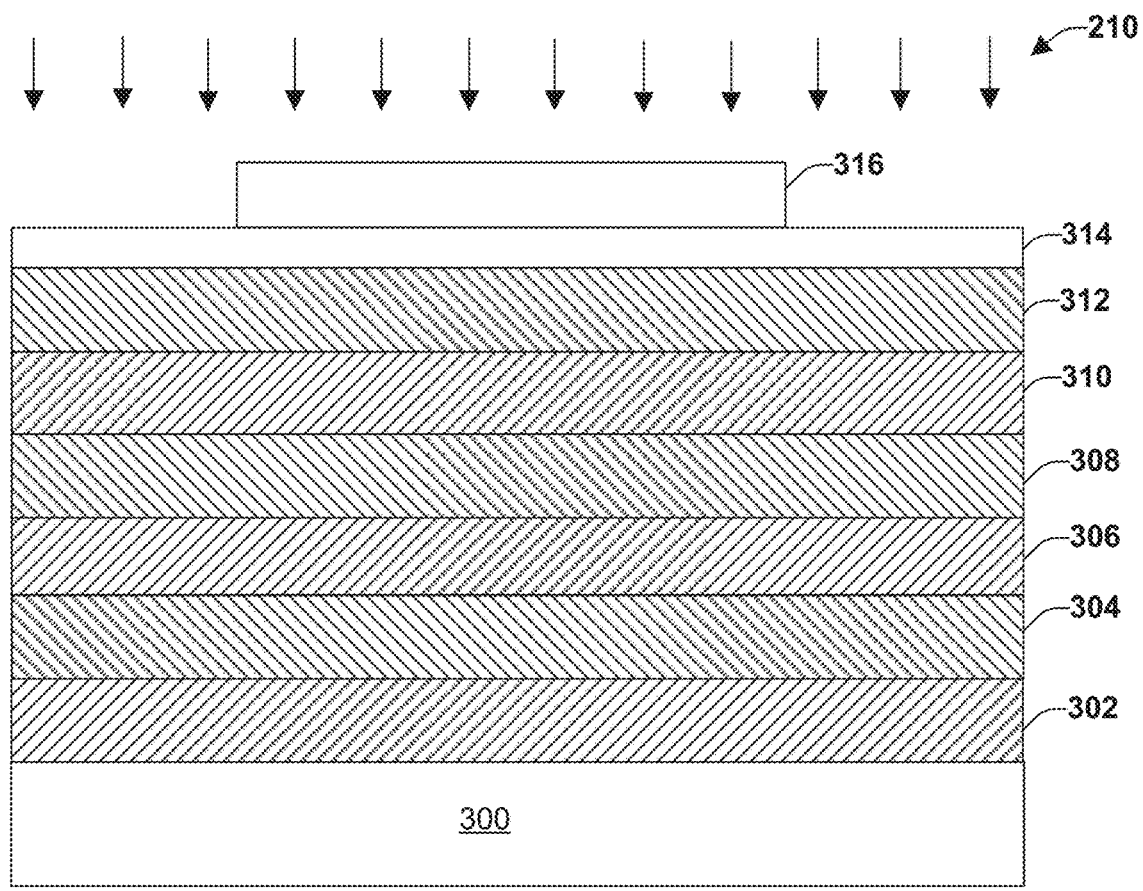
FIG. 5 illustrates a cross-sectional view of the structure of FIG. 4 after a photoresist material layer has been deposited and patterned and while undergoing an etching process.
Figure 6:
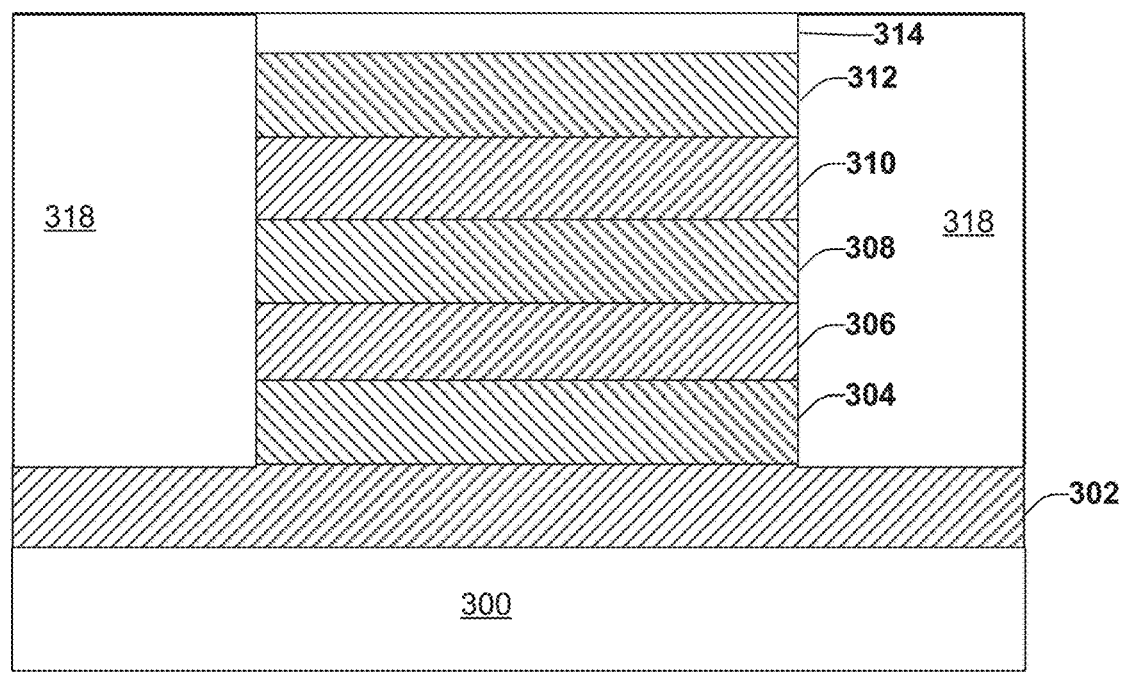
FIG. 6 illustrates a schematic cross-sectional view of the structure of FIG. 5 after the photoresist material layer has been stripped, and after undergoing a back-fill dielectric deposition process.

Next, a photoresist material layer 316 is deposited and patterned over the capping layer 314 to provide the resultant structure of FIG. 5. The photoresist material layer 314 can have a thickness that varies in correspondence with the wavelength of radiation used to pattern the photoresist material layer 316. The photoresist material layer 316 may be formed over the capping layer 314 via spin-coating or spin casting deposition techniques, selectively irradiated (e.g., via deep ultraviolet (DUV) irradiation) and developed to form a general elliptical pattern over the center of the structure of FIG. 4.

FIG. 5 also illustrates performing of an etch 210 (e.g., anisotropic reactive ion etching (RIE)) remove portions of the stacked material layers based on the pattern in the photoresist material layer 316 to form a generally elliptical memory cell configuration. The memory cell can be part of a memory array, while the memory array can reside in a memory system that includes the memory array and peripheral circuitry to read and write to the memory array. The photoresist material layer 316 is thereafter stripped (e.g., ashing in an $O_2$ plasma), and the surrounding openings are back filled in a dielectric deposition process to provide a dielectric material 318 surrounding the remaining stack material layers that form the memory cell and provide the resultant structure of FIG. 6.

Figure 7:
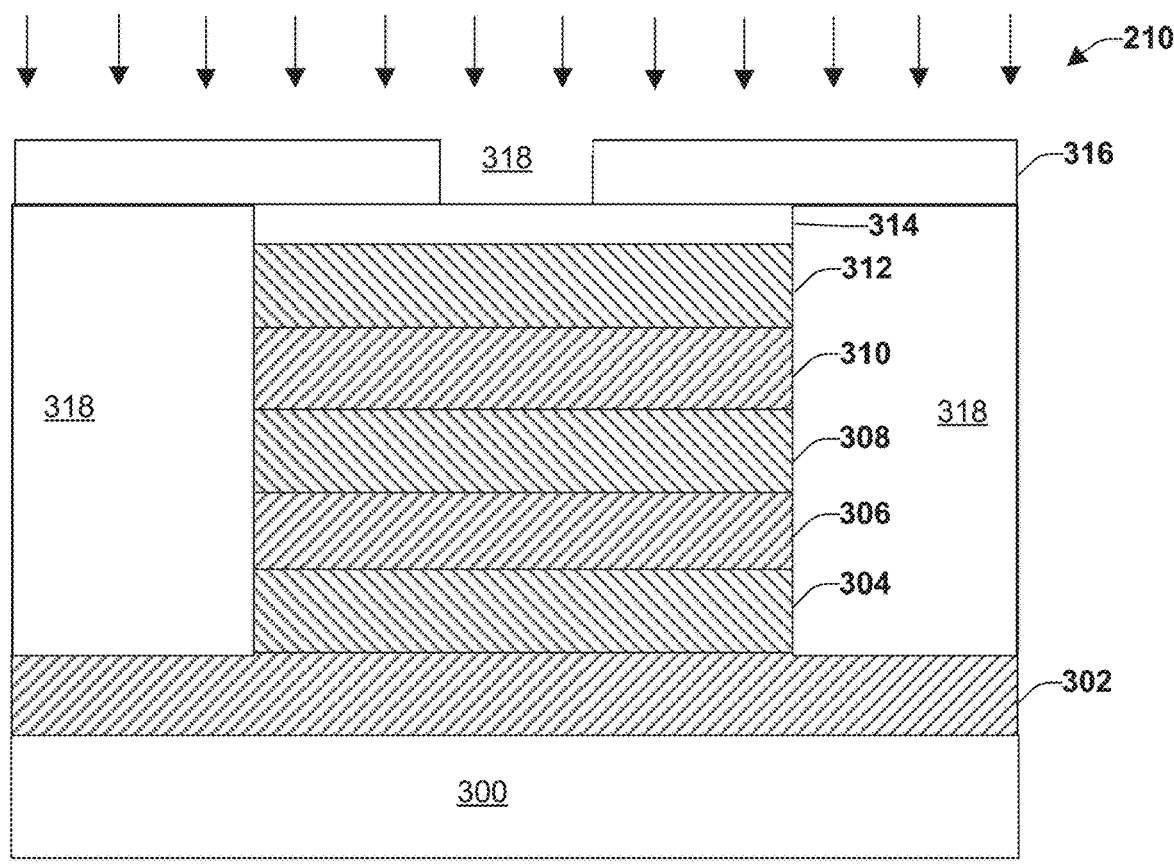
FIG. 7 illustrates a cross-sectional view of the structure of FIG. 6 after a hard mask has been formed and patterned and while undergoing an etching process.

Next, a hard mask 316 is formed with a central opening 318 overlying the stacked layers. The hardmask 316 can be formed by standard dielectric (e.g., Tetraethyl orthosilicate (TEOS)) deposition techniques over the structure of FIG. 6, and the opening formed employing an etching processing to provide the resultant structure of FIG. 7. FIG. 7 also illustrates performing of an etch 220 (e.g., anisotropic reactive ion etching (RIE)) to remove portions of the stacked material layers within the central opening 318 of the hardmask 316 and create a via opening 320 through the capping layer 314 and the antiferromagnetic layer 312 to the second ferromagnetic (FM$_2$) layer 310. The etch 220 can be an ion beam etch process selective to the capping material, and antiferromagnetic material relative to the ferromagnetic material.

Figure 8:
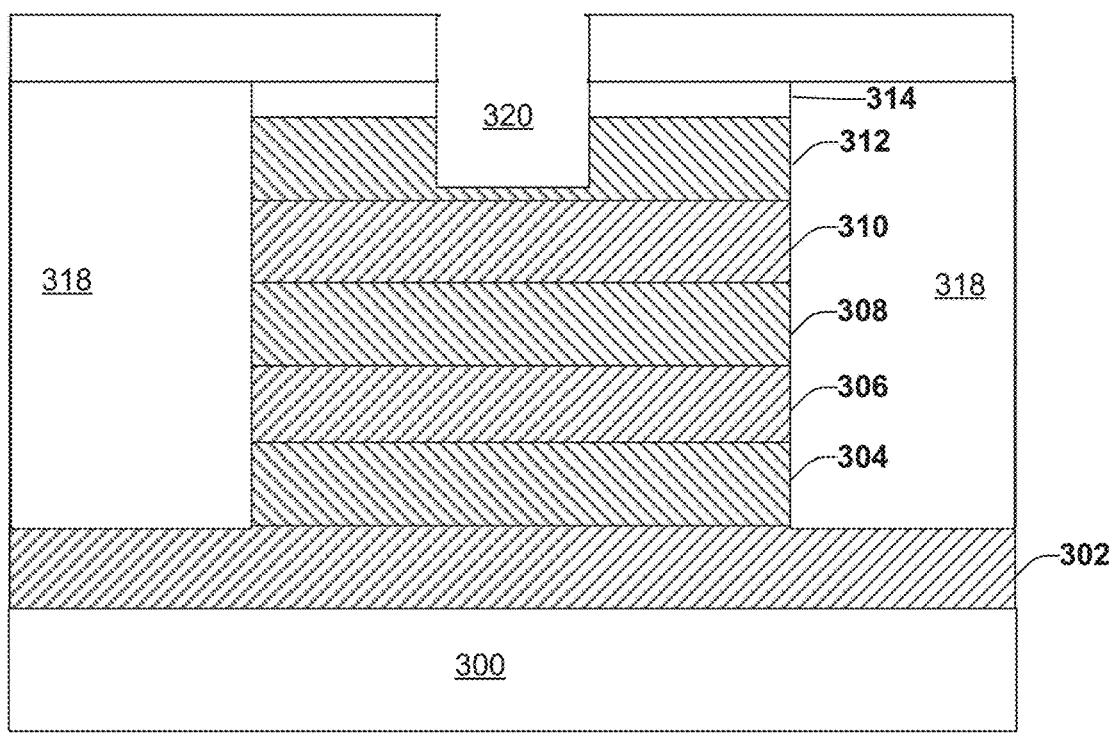
FIG. 8 illustrates a cross-sectional view of the structure of FIG. 7 after a undergoing the etching process.
Figure 9:
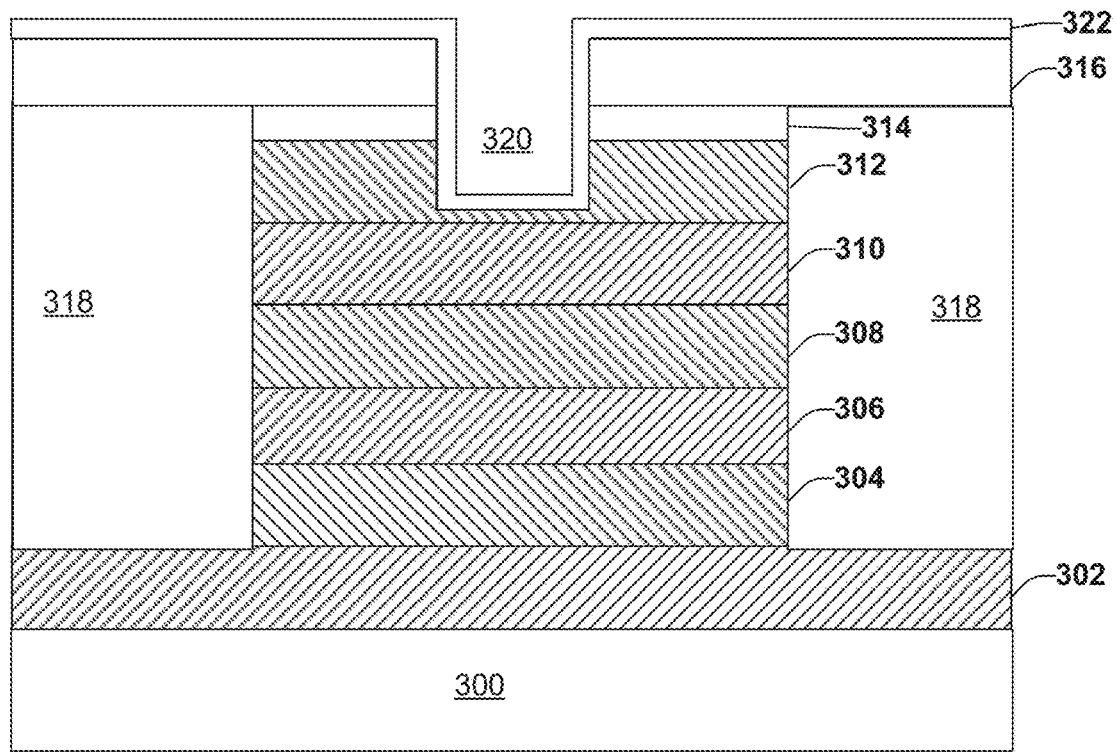
FIG. 9 illustrates a schematic cross-sectional view of the structure of FIG. 6 after a deposition process to form a liner.
Figure 10:
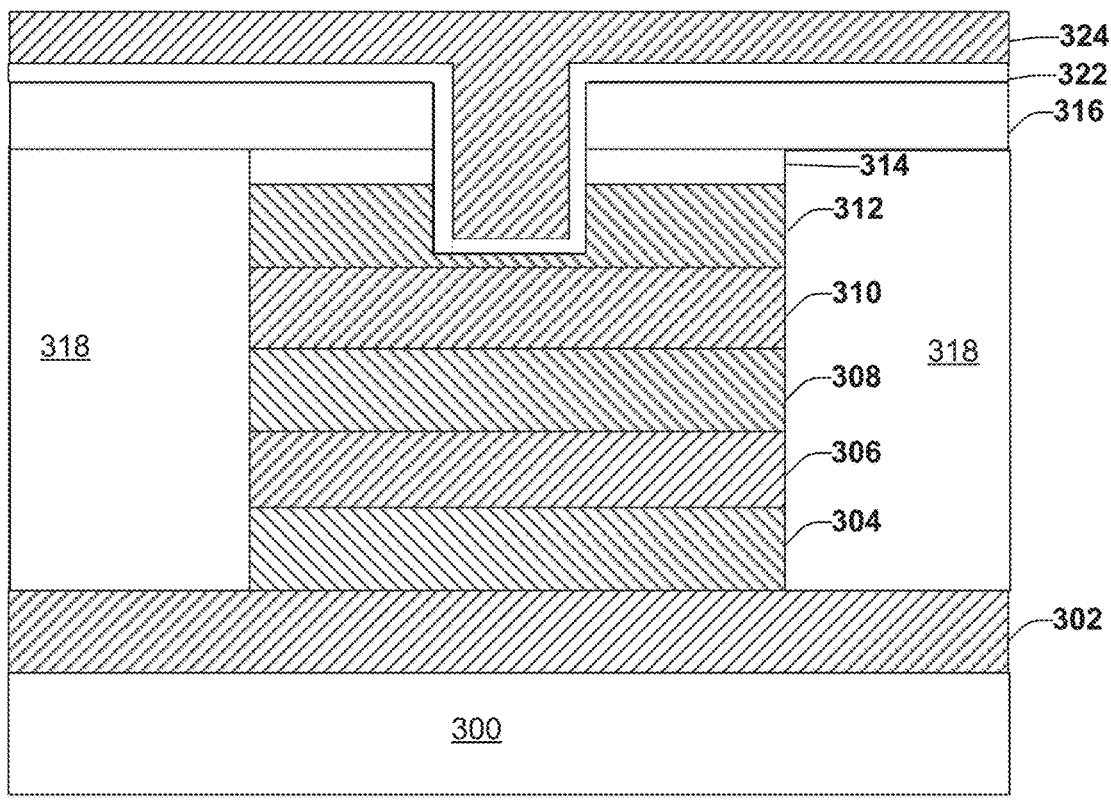
FIG. 10 illustrates a schematic cross-sectional view of the structure of FIG. 9 after a superconductor deposition process.

Next, the structure undergoes a contact material fill to deposit a liner 322 into the via opening 320 and over the structure of FIG. 8 to provide the resultant structure of FIG. 9. The liner 322 prevents oxidation of the magnetic material and can be formed of niobium, copper or aluminum. Next, the structure undergoes a contact material fill to deposit superconducting material into the via opening 320 and over the structure of FIG. 9 to provide a top superconductor electrode 324 as shown in the resultant structure of FIG. 10. The superconductor can be deposited employing a standard contact material deposition. The top superconductor electrode 324 includes a cap portion and an extension plug that passes through the via opening 320 making direct contact with the second ferromagnetic (FM$_2$) layer 310 allowing for a current to pass through the memory cell without interference from the antiferromagnetic (AF) layer 312. The top superconductor electrode 324 can be formed of niobium, or some other superconductor material.

For purposes of simplification of explanation the terms "overlay", "overlaying", "overlying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A memory cell comprising:
    a first superconductor electrode;
    a second superconductor electrode having a cap portion and an extension plug;
    a magnetic Josephson junction (MJJ) stack disposed between the first superconductor electrode and the second superconductor electrode, the MJJ stack including a magnetic reference layer and a magnetic storage layer; and
    a magnetically stabilizing structure disposed between the MJJ stack and the second superconductor electrode, wherein the magnetic stabilizing structure magnetically couples with the magnetic reference layer to strengthen the fixed state of the magnetic reference layer.

2. The memory cell of claim 1, wherein the second superconductor electrode incudes a cap portion and an extension plug.

3. The memory cell of claim 2, wherein the magnetic stabilizing structure includes a via opening that extends through the magnetic stabilizing structure, such that the extension plug passes through the via opening and makes direct contact with the MJJ structure allowing for a current to pass through the memory cell without interference from the magnetically stabilizing structure.

4. The memory cell of claim 1, wherein the magnetic storage layer is formed of a first ferromagnetic layer and the magnetic reference layer is formed of a second ferromagnetic layer separated from one another by a non-magnetic (NM) spacer layer that collectively form the magnetic storage layer of the MJJ stack.

5. The memory cell of claim 1, wherein the magnetically stabilizing structure comprises an antiferromagnet layer.

6. The memory cell of claim 1, wherein the magnetically stabilizing structure comprises a synthetic antiferromagnet stack.

7. The memory cell of claim 6, wherein the synthetic antiferromagnet stack comprises a non-magnetic (NM) material layer sandwiched between a first ferromagnet layer and a second ferromagnet layer.

8. The memory cell of claim 1, further comprising a buffer layer between the MJJ stack and one of the first and second superconductor electrode, and a capping layer disposed between the magnetically stabilizing structure and the other of the first and second superconductor electrode.

9. The memory cell of claim 1, wherein the memory cell has a generally elliptical shape.

10. A memory system comprising a plurality of memory cells as claimed in claim 1.

11. A memory cell comprising:
    a first superconductor electrode;
    a magnetic Josephson junction (MJJ) stack overlying the first superconductor electrode, the MJJ stack including a magnetic reference layer and a magnetic storage layer, and a non-magnetic (NM) material layer that separates the magnetic reference layer from the magnetic storage layer;

a magnetically stabilizing structure overlying the MJJ stack, the magnetic stabilizing structure having a via opening that extends from a first surface of the magnetically stabilizing structure to a first surface of the MJJ stack, wherein the magnetic stabilizing structure magnetically couples with the magnetic reference layer to strengthen the fixed state of the magnetic reference layer; and a second superconductor electrode overlying the magnetic stabilizing structure and having a cap portion and an extension plug, such that the extension plug passes through the via opening and makes direct contact with the MJJ structure allowing for a current to pass through the memory cell without interference from the magnetically stabilizing structure.

12. The memory cell of claim 11, wherein the magnetic storage is formed of a first ferromagnetic layer and the magnetic reference layer is formed of a second ferromagnetic layer separated from one another by a non-magnetic (NM) spacer layer that collectively form the MJJ stack.

13. The memory cell of claim 11, wherein the magnetically stabilizing structure comprises an antiferromagnet layer.

14. The memory cell of claim 11, wherein the magnetically stabilizing structure comprises a synthetic antiferromagnet stack, the synthetic antiferromagnet stack comprises a non-magnetic (NM) material layer sandwiched between a first ferromagnet layer and a second ferromagnet layer.

15. The memory cell of claim 11, further comprising a buffer layer between the MJJ stack and the first superconductor electrode, and a capping layer disposed between the magnetically stabilizing structure and the second superconductor electrode.

16. A method of forming a memory cell, the method comprising:

performing a series of deposition processes over a first superconductor electrode, the series of deposition processes comprising sequentially depositing material layers to form a magnetic Josephson junction (MJJ) stack overlying the first superconductor electrode, and a magnetically stabilizing structure overlying the MJJ stack, forming a mask over the magnetic stabilizing structure having a patterned opening:

performing an etch process to create a via opening that extends through the magnetic stabilizing structure from a first surface of the magnetically stabilizing structure to a first surface of the MJJ stack, wherein the magnetic stabilizing structure magnetically couples with the magnetic reference layer to strengthen the fixed state of the magnetic reference layer; and performing a deposition process to form a second superconductor electrode overlying the magnetic stabilizing structure, second superconductor electrode having a cap portion and an extension plug, wherein the extension plug passes through the via opening and makes direct contact with the MJJ structure allowing for a current to pass through the memory cell without interference from the magnetically stabilizing structure.

17. The method of claim 16, further comprising an etch process to remove outside portions of the sequentially depositing material layers to form a generally elliptical memory cell configuration, and backing filling the removed portion with a dielectric material.

18. The method of claim 16, wherein the MJJ stack including a magnetic reference layer and a magnetic storage layer, and a non-magnetic (NM) material layer that separates the magnetic reference layer from the magnetic storage layer, the magnetic storage layer being formed of a first ferromagnetic layer and the magnetic reference layer being formed of a second ferromagnetic layer separated from one another by a non-magnetic (NM) spacer layer that collectively form the MJJ stack.

19. The method of claim 16, wherein the magnetically stabilizing structure comprises an antiferromagnet layer.

20. The method of claim 16, wherein the magnetically stabilizing structure comprises a synthetic antiferromagnet stack, the synthetic antiferromagnet stack comprises a non-magnetic (NM) material layer sandwiched between a first ferromagnet layer and a second ferromagnet layer.

* * * * *